(12) United States Patent
Chung et al.

(10) Patent No.: US 8,642,458 B2
(45) Date of Patent: Feb. 4, 2014

(54) METHOD OF FABRICATING NONVOLATILE MEMORY DEVICE

(75) Inventors: Byung-Hong Chung, Seoul (KR); Young-Hee Kim, Austin, TX (US); In-Sun Yi, Suwon-si (KR); Han-Mei Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 44 days.

(21) Appl. No.: 13/414,085

(22) Filed: Mar. 7, 2012

(65) Prior Publication Data

US 2012/0315752 A1    Dec. 13, 2012

(30) Foreign Application Priority Data

Jun. 13, 2011    (KR) .................. 10-2011-0057025

(51) Int. Cl.
*H01L 21/4763*    (2006.01)

(52) U.S. Cl.
USPC ........... 438/593; 438/201; 438/211; 438/257; 438/587; 438/646; 438/660; 438/661; 438/662

(58) Field of Classification Search
USPC ............. 438/201, 211, 257, 587, 593, 646, 438/660–662
See application file for complete search history.

(56) References Cited

U.S. PATENT DOCUMENTS

| 6,063,662 | A | * | 5/2000 | Bui | 438/257 |
| 6,258,669 | B1 | * | 7/2001 | Park | 438/264 |
| 6,274,433 | B1 | * | 8/2001 | Ramsbey et al. | 438/264 |
| 6,638,861 | B1 | * | 10/2003 | Ngo et al. | 438/685 |
| 6,900,121 | B1 | * | 5/2005 | Ngo et al. | 438/632 |
| 6,914,013 | B2 | * | 7/2005 | Chung | 438/770 |
| 2005/0079662 | A1 | * | 4/2005 | Miki | 438/200 |
| 2005/0233524 | A1 | * | 10/2005 | Lee | 438/264 |
| 2006/0292794 | A1 | * | 12/2006 | Joo | 438/257 |
| 2008/0237680 | A1 | * | 10/2008 | Pangal et al. | 257/315 |
| 2010/0155807 | A1 | * | 6/2010 | Kalavade et al. | 257/316 |
| 2011/0260235 | A1 | * | 10/2011 | Orimoto et al. | 257/319 |
| 2012/0074485 | A1 | * | 3/2012 | Ham et al. | 257/316 |

FOREIGN PATENT DOCUMENTS

| KR | 1020060124855 A | 12/2006 |
| KR | 1020100076320 A | 7/2010 |
| KR | 1020100076323 A | 7/2010 |

* cited by examiner

*Primary Examiner* — Bac Au
(74) *Attorney, Agent, or Firm* — Volentine & Whitt, PLLC

(57) ABSTRACT

A method of fabricating a nonvolatile memory device includes providing an intermediate structure in which a floating gate and an isolation film are disposed adjacent to each other on a semiconductor substrate and a gate insulating film is disposed on the floating gate and the isolation film, forming a conductive film on the gate insulating film, and annealing the conductive film so that part of the conductive film on an upper portion of the floating gate flows down onto a lower portion of the floating gate and an upper portion of the isolation film.

16 Claims, 18 Drawing Sheets

US 8,642,458 B2

METHOD OF FABRICATING NONVOLATILE MEMORY DEVICE

PRIORITY STATEMENT

This application is based on and claims priority from Korean Patent Application No. 10-2011-0057025, filed on Jun. 13, 2011 in the Korean Intellectual Property Office, the disclosure of which is incorporated by reference herein in its entirety.

BACKGROUND

1. Field

The present inventive concept relates to a method of fabricating a nonvolatile memory device.

2. Description of the Related Art

Nonvolatile memory devices are memory devices in which data stored therein is not cleared when the power supply to the devices is interrupted. Nonvolatile memory devices include, for example, PROMs (Programmable ROMs), EPROMs (Erasable PROMs), EEPROMs (Electrically EPROMs), and flash memory devices. In flash memory devices, the electrical programming and erasing of data is performed using F-N tunneling (Fowler-Nordheim tunneling) or channel hot electron injection. Also, flash memory devices have diverse types of memory cells, and a flash memory device may be generally classified as a NAND type or NOR type of flash memory device depending on the cell array structure of the device.

SUMMARY

According to one aspect of the inventive concept, there is provided a method of fabricating a nonvolatile memory device, comprising: providing a structure including a floating gate on a semiconductor substrate, an isolation film adjacent to the floating gate on the semiconductor substrate, and a gate insulating film extending over a side wall of the floating gate and the upper surface of the isolation film, forming a conductive layer on the gate insulating film, and annealing the conductive layer to such an extent that part of the conductive layer flows from the level of an upper portion of the floating gate down to the level of a lower portion of the floating gate over an upper portion of the isolation film.

According to another aspect of the inventive concept, there is provided a method of fabricating a nonvolatile memory device, comprising: providing a structure including a floating gate and a 0.1 to 20 nm wide isolation film adjacent to each other on a semiconductor substrate, and a gate insulating film extending over the floating gate and the isolation film, forming a conductive layer having voids therein on the gate insulating film, and annealing the conductive layer to such an extent that the conductive layer flows enough to eliminate the voids.

According to yet another aspect of the inventive concept, there is provided a method of fabricating a semiconductor memory device, comprising: forming floating gates spaced apart from one another along an axis on a semiconductor substrate such that a gap exists between adjacent ones of the floating gates, forming a gate insulating film on a structure comprising the floating gates such that the gate insulating film has a topography conforming to upper surfaces and at least part of the sidewall surfaces of the floating gates, forming a conductive layer on the gate insulating film, and annealing the conductive layer to such an extent that part of the conductive layer flows down from upper portions of the floating gates towards lower portions of the floating gates.

BRIEF DESCRIPTION OF THE DRAWINGS

The above aspects and other objects, features and advantages of the inventive concept will be more apparent from the following detailed description taken in conjunction with the accompanying drawings, in which.

DETAILED DESCRIPTION OF THE PREFERRED EMBODIMENTS

Figure 1:
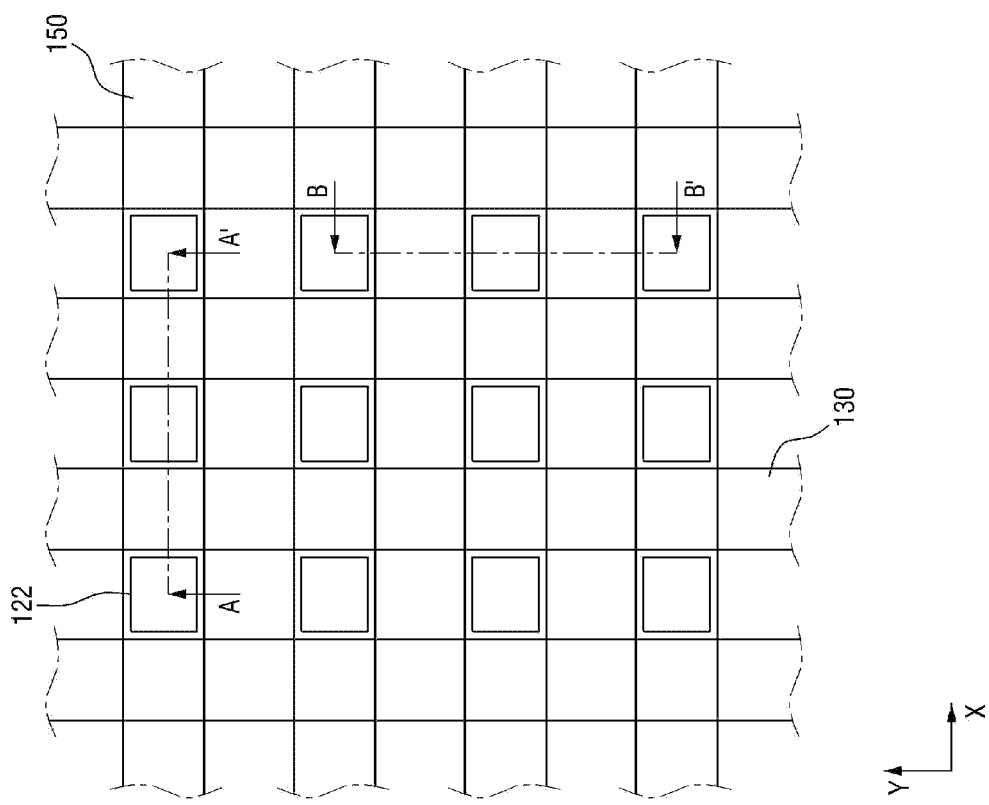
FIG. 1 is a conceptual plan view of a nonvolatile memory device that may be fabricated according to the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer in question is referred to as being "on" another element or layer, the element or layer in question can be directly on the other element or layer or intervening elements or layers may be present.

Furthermore, the terms first, second, third etc. are used herein to describe various elements, layers or processes. However, these elements, layers, and/or processes are not limited by these terms. Rather, these terms are only used to distinguish one element, layer or process from another.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Furthermore, the meanings of the terms "layer" and "film" are to be taken in context especially with reference to the drawings. For instance, either term "layer" or "film" may be used to denote a monolayer or a laminate. Also, the term "film"

may be used at times to denote a contiguous layer or merely a segment or discrete section of a contiguous or non-contiguous layer of material.

An example of a nonvolatile memory device of a type that can be fabricated according to the inventive concept will now be described with reference to FIGS. 1 to 2. This example is a NAND type flash memory device, but the inventive concept is not limited thereto and may be used to fabricate other types of nonvolatile memory devices as will be readily apparent from the description of the method that follows.

Figure 2:
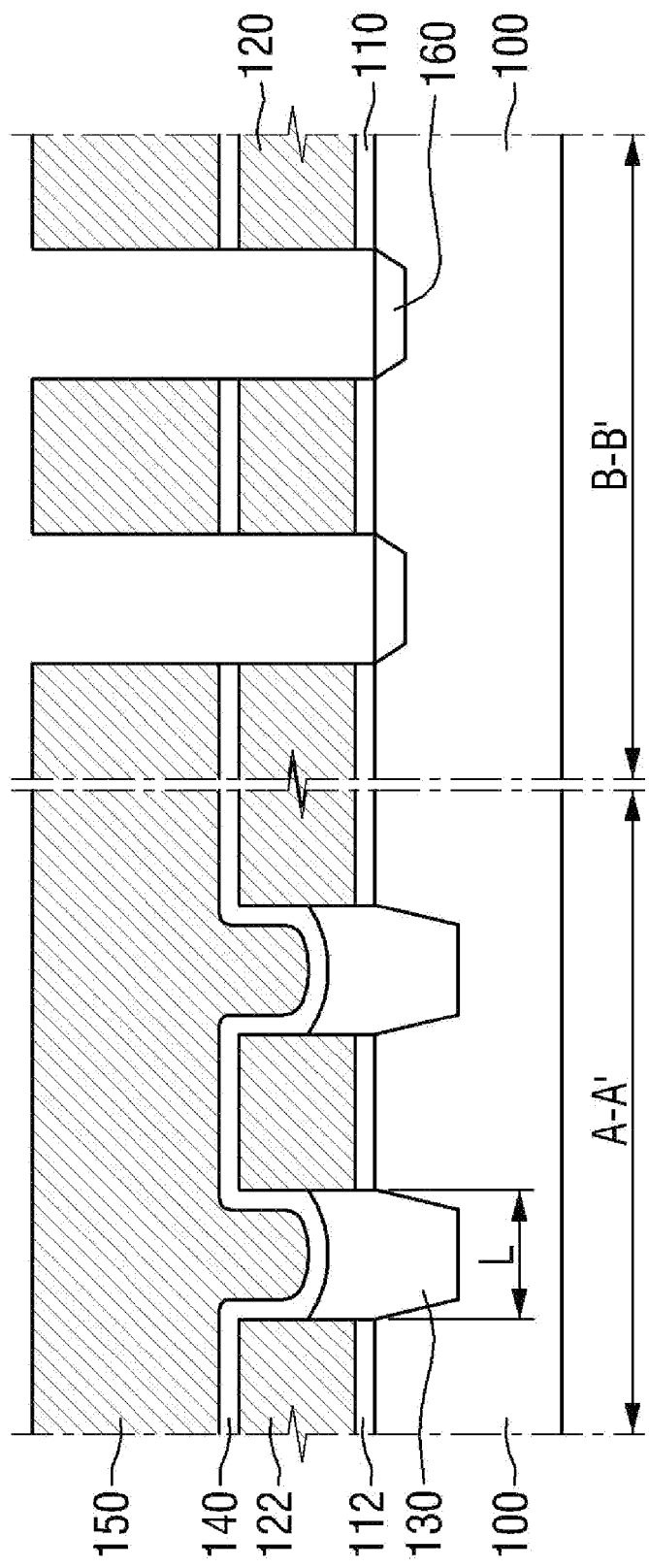
FIG. 2 is a sectional view taken along lines A-A' and B-B' of FIG. 1.

Referring to FIGS. 1 and 2, the nonvolatile memory device has a semiconductor substrate 100 on which active areas are defined by isolation films 130.

The semiconductor substrate 100 may be a bulk silicon substrate, a silicon-on-insulator (SOI) substrate, a germanium substrate, a germanium-on-insulator (GOI) substrate, a silicon-germanium substrate, or an epitaxial thin film substrate that is produced by a selective epitaxial growth (SEG) process.

The isolation films 130 have the form of lines, as viewed in plan, extending longitudinally in a first direction (Y direction in FIG. 1), and may be insulating films that are buried in trenches formed in the semiconductor substrate 100. The isolation films 130 are thus parallel to one another and are spaced apart from one another, and define active areas in the form of a line pattern. Furthermore, the isolation films 130 may project from the surface of the semiconductor substrate 100, and an upper portion of each of the isolation films 130 may be recessed. The width (L) of each isolation film 130 may be 0.1 to 20 nm.

A tunnel insulating film 112 and a floating gate 122 are laminated on each active area of the semiconductor substrate 100. More specifically, in this example, a tunnel insulating film 112 and floating gate 122 are disposed locally at each region of the device where an active area and a control gate 150 (described in more detail below) cross each other.

The tunnel insulating film 112 may be a thin film formed on the semiconductor substrate 100. For example, the tunnel insulating film 112 is a film of silicon oxide (SiO2) formed by a thermal oxidation process. alternatively, the tunnel insulating film 112 may be formed of at least one layer of material having a high dielectric constant, e.g., may be of at least one material selected from the group consisting of Al2O3, HfO2, ZrO2, La2O3, Ta2O3, TiO2, SrTiO3 and BaSrTiO3.

The floating gate 122 may be a polysilicon film doped with N-type or P-type impurities. As mentioned above, each floating gate 122 is disposed on a tunnel insulating film 112 on that part of an active region crossed by a control gate 150. On the other hand, as illustrated, the floating gates 122 and isolation films 130 are alternately disposed, adjacent to each other, in a second direction (X direction the figure) which, in this example, is perpendicular to the first direction.

When data is stored or erased in the nonvolatile memory device, charges move to the semiconductor substrate 100 or the floating gate 122 through the tunnel insulating film 112 by F-N tunneling. In this case, the charges which have tunneled through the tunnel insulating film 112 are accumulated in the semiconductor substrate 100 or the floating gate 122.

The upper surface of the isolation film 130 is located at a level beneath that of the upper surface of the floating gate 122 and above that of the upper surface of the tunnel insulating film 112. Gate insulating films 140 are spaced from each other in the first direction (Y direction in FIG. 1) and are conformally formed on the isolation films 130 and the floating gates 122. Specifically, each gate insulating film 140 is contiguous along and covers the upper surface and both side surfaces of the floating gates 122 that are aligned in the second direction, and the upper surfaces of the corresponding isolation films 130. Accordingly, the contact area between each floating gate 122 and the gate insulating film 140 extending thereover, and the coupling ratio between each control gate 150 and the floating gates 122 associated therewith are relatively great.

The gate insulting films 140 serve to isolate the floating gates 122 and the control gates 150 from each other. The gate insulating film 140 may be formed of dielectric material having a high dielectric constant. For example, the gate insulating film 140 may be a laminate of a lower oxide layer, a nitride layer, and an upper oxide layer. The lower and upper oxide layers may each be a metal oxide selected from the group consisting of AL2O3, HfO2, ZrO2, La2O3, Ta2O3, TiO2, SrTiO3, and BaSrTiO3, and the nitride film may be of silicon nitride (SixNy, where x and y are positive integers).

The control gates 150 are formed on the gate insulating films 140, respectively. Specifically, each control gate 150 extends longitudinally in the second direction (X direction) over and along with a respective insulating film 140 and across the active areas on which several of the floating gates 122 are disposed, respectively. The control gate 150 serves to maintain the voltage of the floating gates 122.

On the other hand, although not illustrated, an oxide film for recovering etching damage may be thinly formed on the surface of the control gate 150 and the surface of the semiconductor substrate 100.

On both the active areas of the floating gate 122 and the control gate 150, impurity areas 160 may be formed, and by applying a predetermined voltage to the control gate 150, a channel region may be formed between the impurity areas.

Next, with reference to FIGS. 3 to 11, a method for fabricating a nonvolatile memory device according to an embodiment of the present inventive concept will be described.

A method of fabricating such a nonvolatile memory device according to the inventive concept will now be described in detail with reference to FIGS. 3 to 11.

Figure 3:
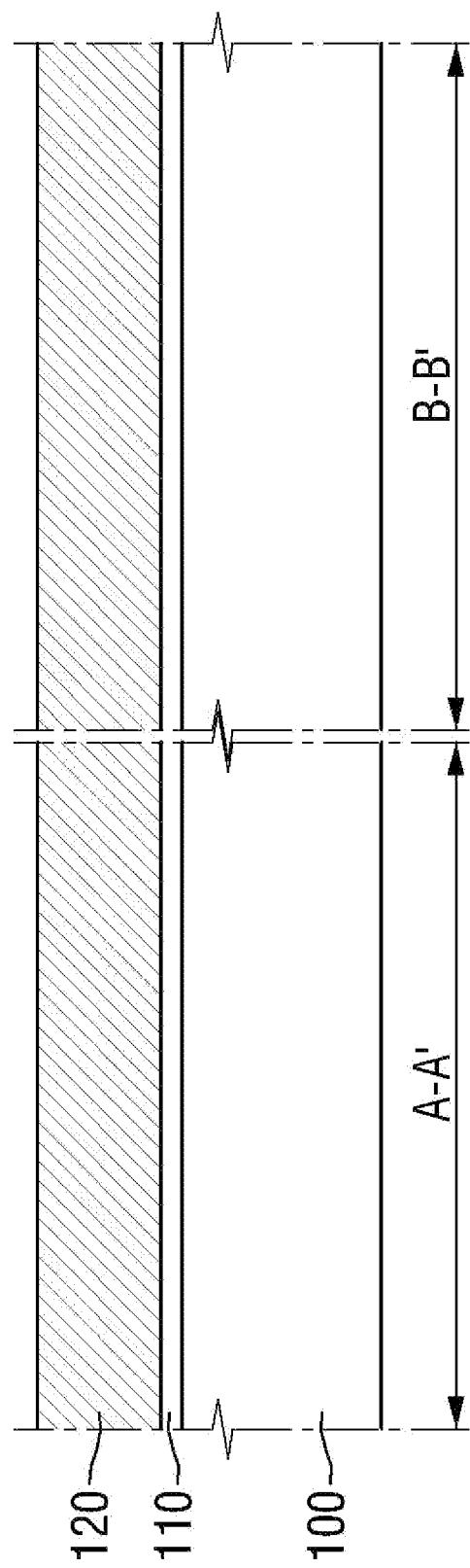
FIGS. 3 to 11 are sectionals views illustrating intermediate steps of an embodiment of a method of fabricating a nonvolatile memory device according to the inventive concept.

Referring first to FIG. 3, a first insulating film 110 and a conductive film 120 are formed on semiconductor substrate 100. The first insulating film 110 is formed of silicon oxide (SiO2) by a thermal oxidation process, for example. Alternatively, the first insulating film 110 is formed of at least one layer of material having a high dielectric constant (high-k dielectric), such as Al2O3, HfO2, ZrO2, La2O3, Ta2O3, TiO2, SrTiO3, and BaSrTiO3, by CVD (Chemical Vapor Deposition) or ALD (Atomic Layer Deposition).

The conductive film 120 is formed by depositing a polysilicon film on the first insulating film 110, and doping the polysilicon film while it is being deposited with N-type or P-type impurities (for example, phosphorus or boron). Alternatively, the polysilicon may be doped in-situ with carbon through a process employing a source gas comprising the carbon.

Figure 4:
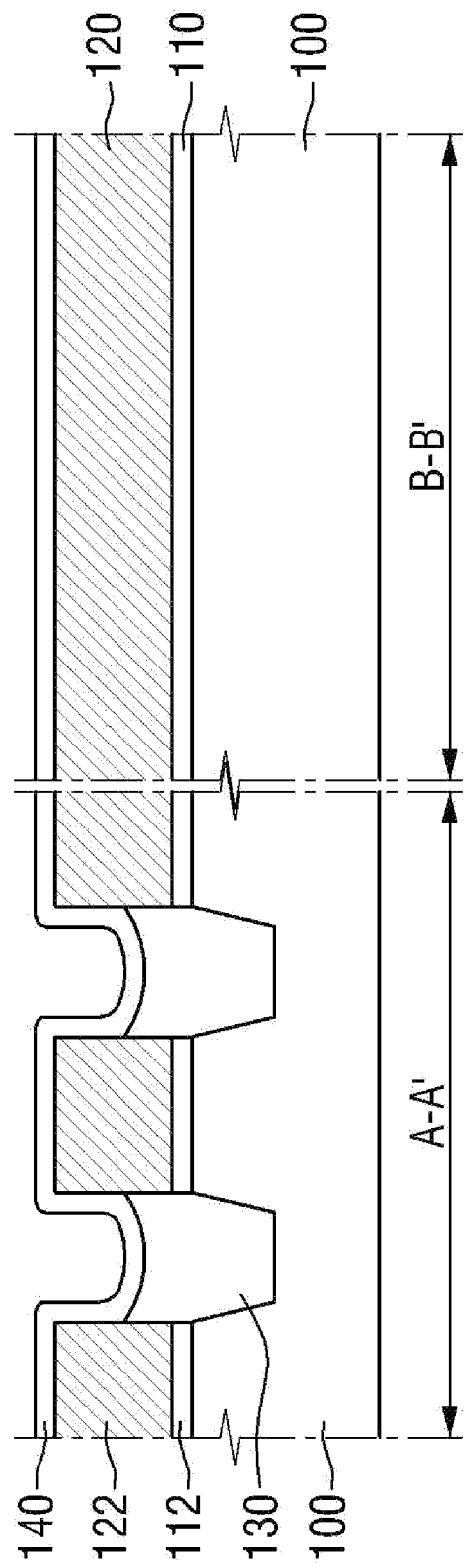

Next, referring to FIG. 4, a mask (not illustrated) is formed on the conductive film 120, and trenches for defining the active areas are etched in the semiconductor substrate 100 using the mask as an etching mask. The etching process in the present embodiment is an anisotropic etching process. Thus, in the case in which the trenches are in the form of lines, the trenches taper towards the bottom thereof. As the trenches are formed, the tunnel insulating films 112 and the floating gates 122 are formed on the active areas of the semiconductor substrate 100.

Subsequently, the mask (not illustrated) is removed from the floating gate 122, and as illustrated in FIG. 4, a second insulating film (not illustrated) is formed in the trenches. Specifically, the second insulating film (not illustrated) is deposited on the semiconductor substrate 100 to such a thickness as to fill the trenches and cover the floating gates 122. The second insulating film may be a film of USG (Undoped Silicate Glass) or TEOS (Tetra-Ethyl-Ortho-Silicate) or an HDP (High Density Plasma) oxide film, for example.

Next, the second insulating film (not illustrated) is planarized until the upper surfaces of the floating gates 122 are exposed. As a result, the second insulating film is buried in the trenches. Then, upper portions of the second insulating film (not illustrated) are recessed to form the isolation films 130. At this time, the isolation films 130 expose the upper parts of the side walls of the floating gates 122.

Then gate insulating film 140 is conformally formed on the floating gates 122 and the isolation films 130. Accordingly, the gate insulating film 140 covers the upper surfaces and upper parts of the side surfaces of the floating gates 122, and covers the upper surfaces of the isolation films 130, as previously described.

The gate insulating film 140 may be formed by a thermal oxidation process, or may be formed by forming an oxide, a nitride, and an oxide one atop the other in the foregoing sequence. In the latter case, the lower and upper oxides may each be a metal oxide. The metal oxide may be selected from the group consisting of $AL_2O_3$, $HfO_2$, $ZrO_2$, $La_2O_3$, $Ta_2O_3$, $TiO_2$, $SrTiO_3$, and $BaSrTiO_3$, and the nitride may be a silicon nitride ($Si_xN_y$, where x and y are positive integers). Alternatively, the gate insulating film may be formed by forming layers of silicon oxide, silicon nitride, and silicon oxide one atop the other in the foregoing order.

Figure 5:
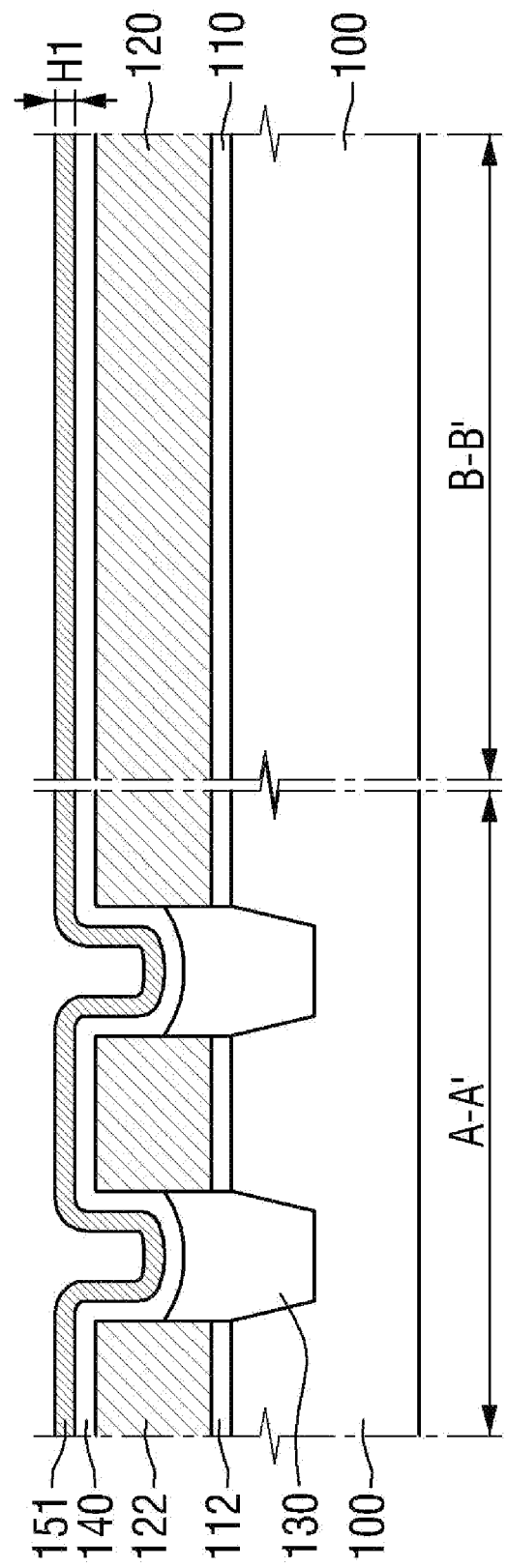

Next, referring to FIG. 5, a first conductive film 151 is formed on the gate insulating film 140. Specifically, the first conductive film 151 is conformally formed on the gate insulating film 140 to a first thickness H1.

The first conductive film 151 may be a polysilicon film. In this case, the first conductive film 151 is not be doped with N-type or P-type impurities. That is, the first conductive film 151 may be an undoped polysilicon film.

Figure 6:
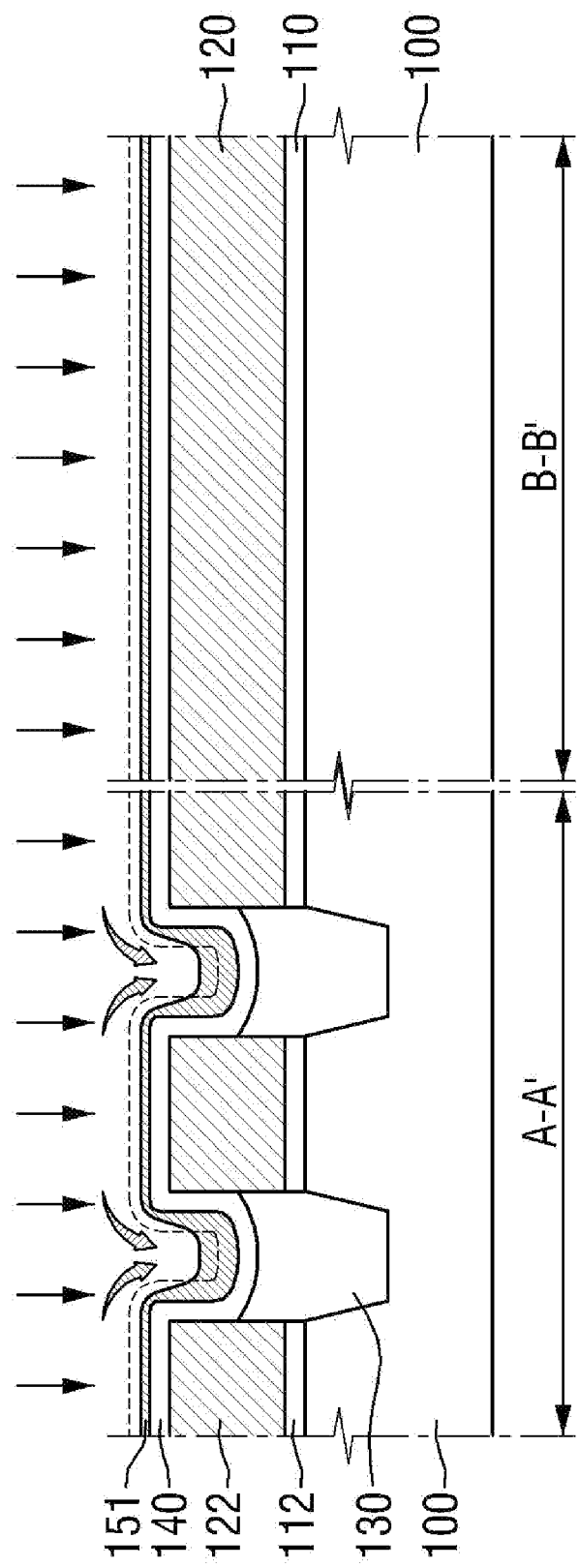

Next, referring to FIG. 6, the first conductive film 151 is annealed. In this embodiment, the first conduction film 151 is annealed by irradiating the first conductive film 151 with laser beams. The laser annealing weakens the polysilicon that forms the first conductive film 151. Accordingly, the flowability of the first conductive film 151 is increased.

As a result, portions of the first conductive film 151 on the upper surface and upper parts of the side walls of the floating gates 122 migrate towards or flow down onto the lower portions of the floating gates 122 and the upper portions of the isolation films 130.

Figure 7:
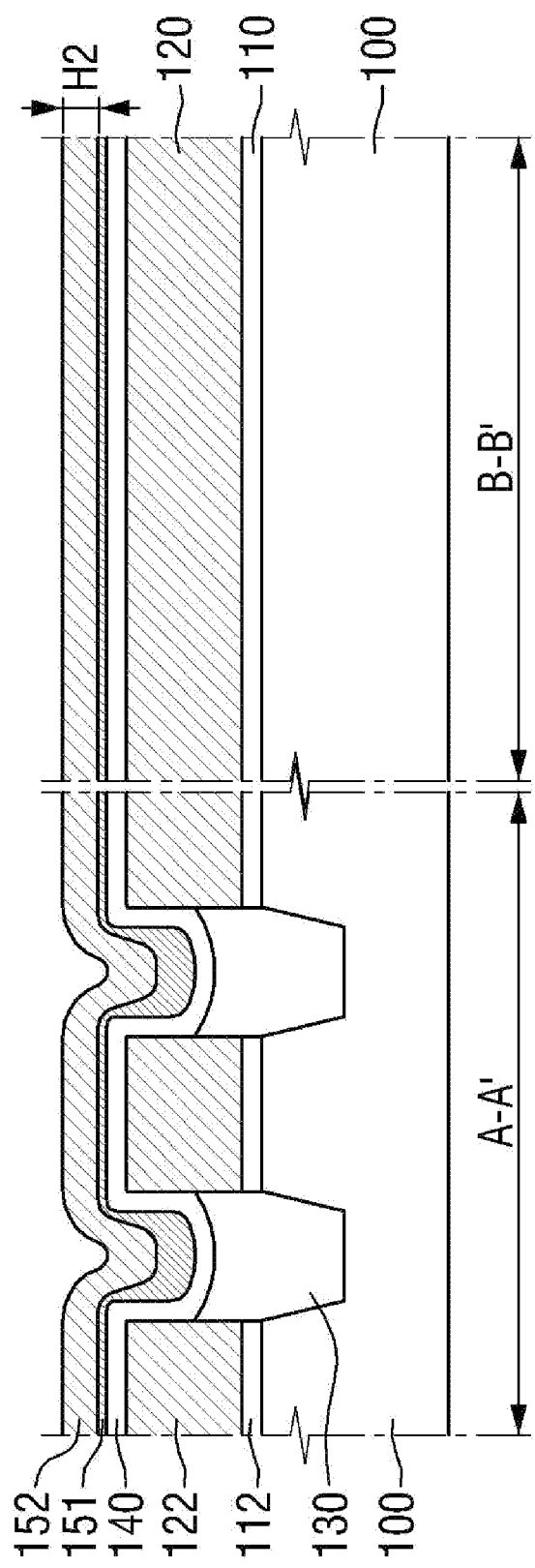

Next, referring to FIG. 7, a second conductive film 152 is formed on the first conductive film 151. For example, the second conductive film 152 is a polysilicon film. The second conductive film 152 may also be a film doped with N-type or P-type impurities at a first concentration. Moreover, the second conductive film 152 is conformally formed on the first conduction film 151 to a second thickness H2. In this embodiment, the second thickness H2 is larger than the first thickness H1 (FIG. 5).

Especially in a case in which the distance between adjacent ones of the floating gates 122 (or the width of an isolation film 130) is narrow (for example, 0.1 to 20 nm or less), and in which the first conductive film 151 is not formed, voids 170 (see FIG. 14) may be formed in the control gate 150. Such voids 170, if left untreated, would lower the reliability of the semiconductor device or end product. However, according to the above-described embodiment of the present inventive concept, the first conductive film 151 is conformally formed on the upper portions of the floating gates 122 and is then annealed so as to flow down onto the lower portions of the floating gates 122 and the upper portions of the isolation films 130. Thus, voids 170 (FIG. 14) can be prevented from being formed in the control gates, the fabrication of which is completed in this embodiment as follows.

Figure 8:
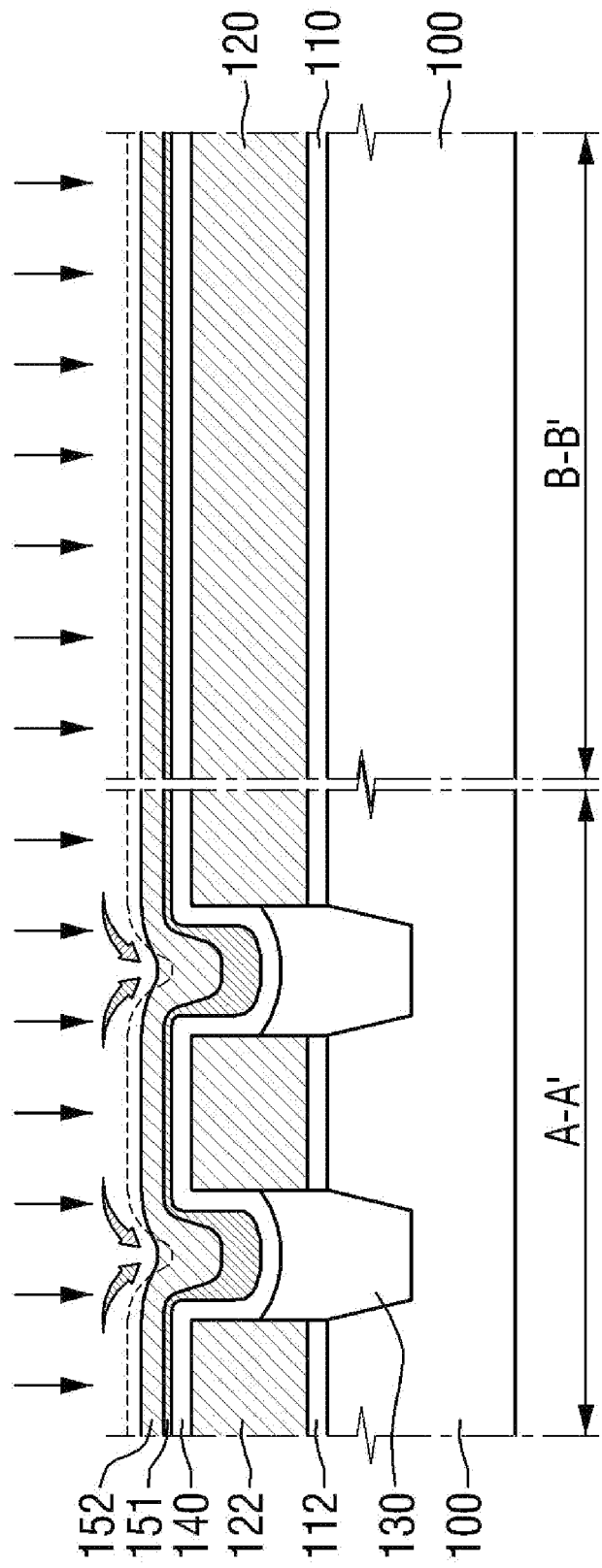

Referring to FIG. 8, the second conductive film 152 is annealed. In this embodiment, the second conductive film 152 is annealed by irradiating the second conductive film 152 with laser beams. As a result, the polysilicon constituting the second conductive film 152 is weakened. Accordingly, that portion of the second conductive film 152 on the upper portions of the floating gates 122 flows down onto the lower portions of the floating gates 122 and the upper portions of the isolation films 130, thereby also contributing to the prevention of voids in those parts of the control gates formed on the isolation films 130.

Figure 9:
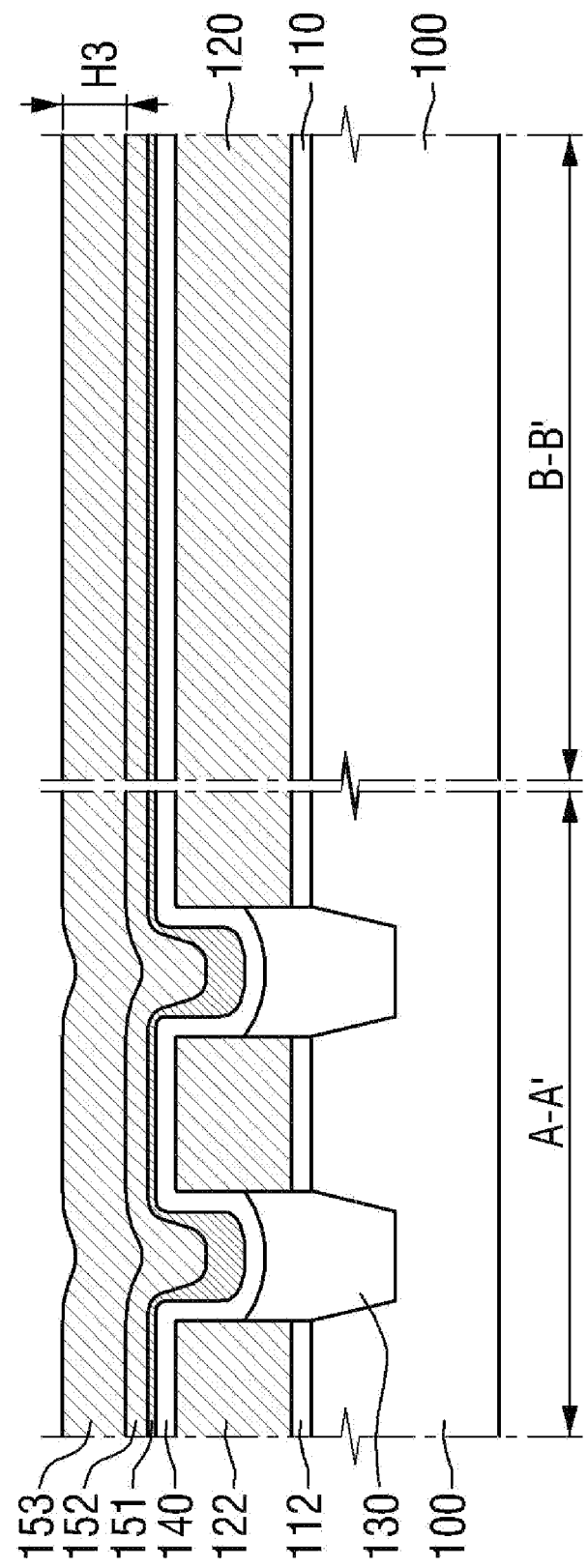

Next, referring to FIG. 9, a third conductive film 153 is formed on the second conductive film 152. In this embodiment, the third conductive film 153 is conformally formed on the second conductive film 152 to a third thickness H3 greater than the second thickness H2 (FIG. 7).

The third conductive film 153 may be a polysilicon film. Furthermore, the third conductive film 153 may be a film doped with impurities N-type or P-type impurities at a second concentration higher than the first concentration (the concentration of impurities in the second conductive film 152).

Figure 10:
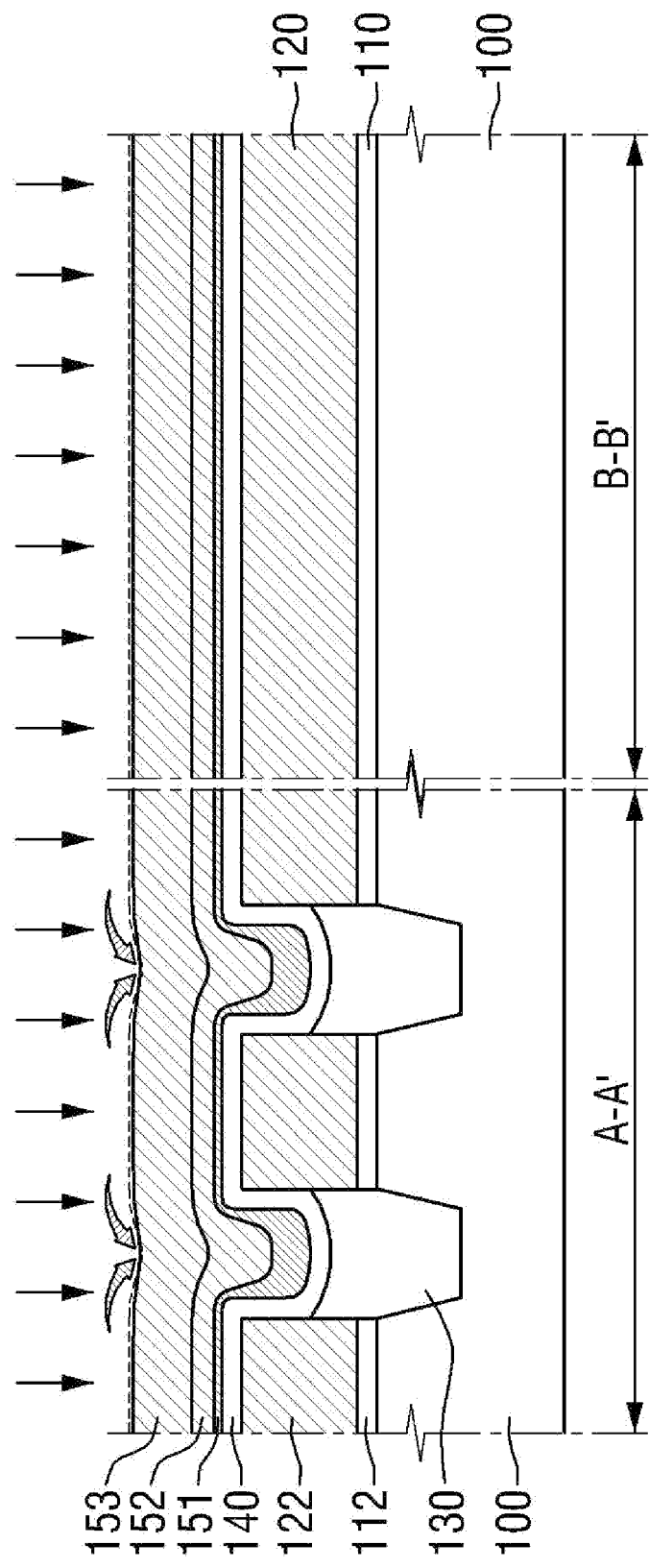

Next, referring to FIG. 10, the third conductive film 153 is annealed. In this embodiment, the third conduction film 153 is annealed by irradiating the third conductive film 153 with laser beams. As a result, the polysilicon that constitutes the third conductive film 153 is weakened. Accordingly, the third conductive film 153 flows from the upper portions of the floating gates 122 down onto the lower portions of the floating gates 122 and the upper portions of the isolation films 130, thereby also contributing to the prevention of voids in those parts of the control gates formed on the isolation films 130.

Note, impurities may be added to any of the first, second and third conductive films 151 to 153, formed as described above, for adjusting the size of grains of the films 151 to 153. Such impurities may be carbon (C) or fluorine (F), or the like, but the present inventive concept is not limited thereto.

Figure 11:
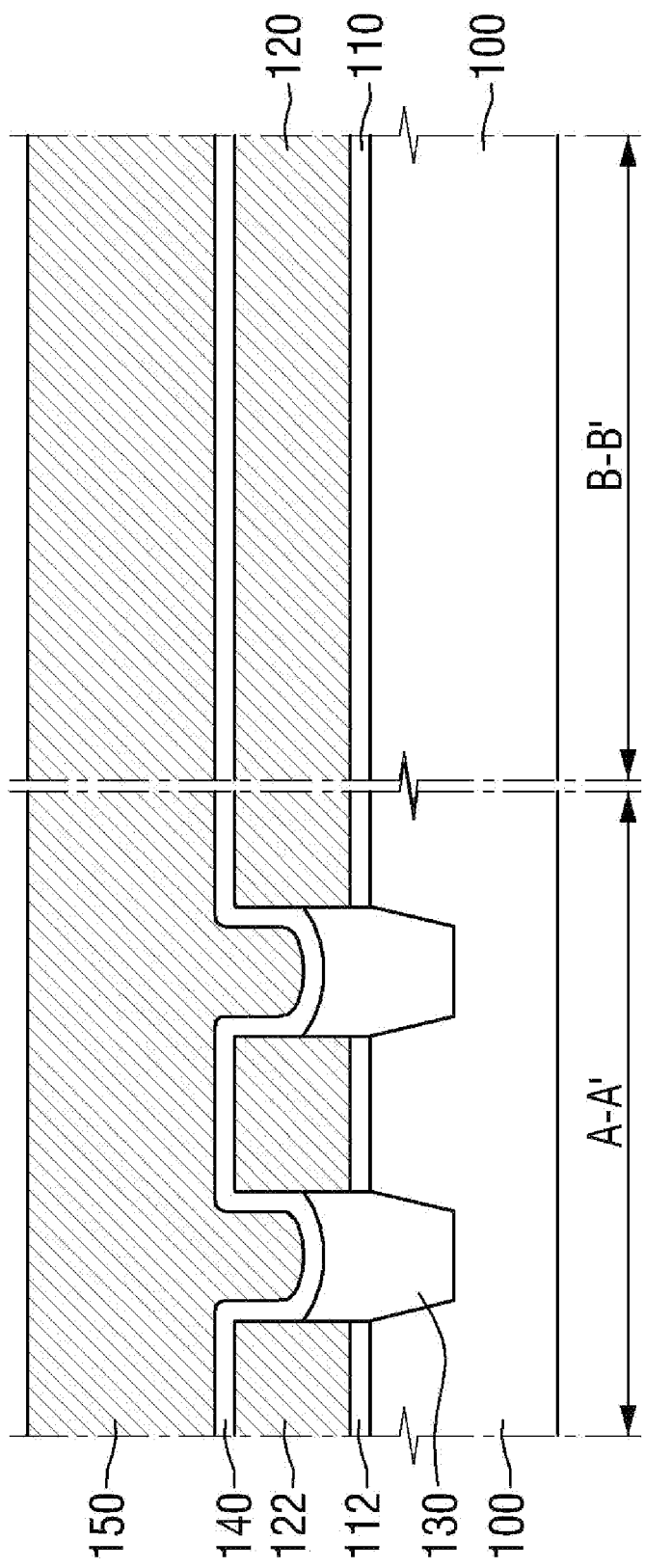

Next, referring to FIG. 11, additional conductive material, as much as needed, is deposited to complete the forming of control gate 150. For the reasons described above, there are no voids inside the control gate 150.

Next, referring to back to FIG. 2, a mask (not illustrated) is formed on the control gate 150, and the control gate 150, the gate insulating film 140, the floating gates 122, and the tunnel insulating film 112 are etched in the second direction (Y direction) using the mask (not illustrated) as an etching to expose a surface of the semiconductor substrate 100. Then, impurity areas 160 are formed by injecting N-type or P-type impurities into the exposed surface of the semiconductor substrate 100.

Another embodiment of a method of fabricating a nonvolatile memory device according to the inventive concept will now be described with reference to FIGS. 12 and 13. In this respect, principally only those steps/techniques which differentiate this embodiment from that of FIGS. 3-11 will be described in detail.

Figure 12:
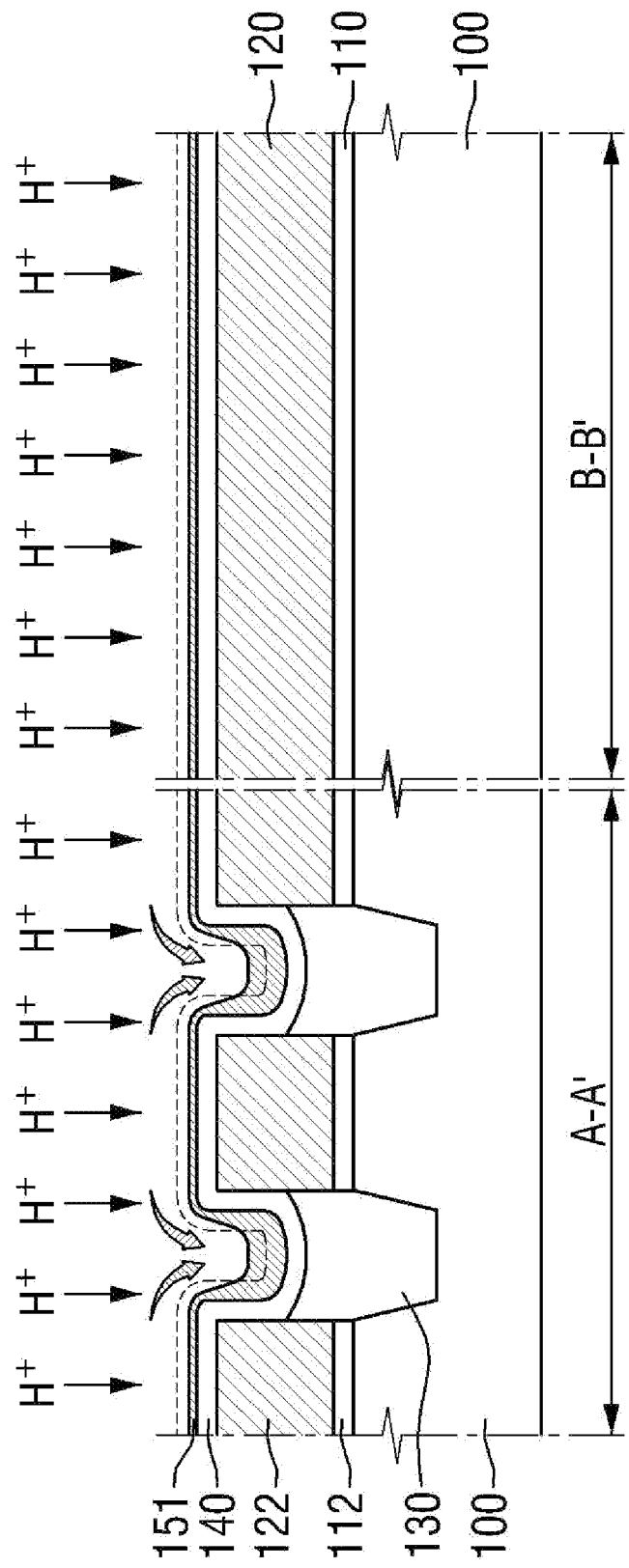
FIGS. 12 and 13 are sectional views illustrating intermediate steps of another embodiment of a method of fabricating a nonvolatile memory device according to the inventive concept.

Referring to FIG. 12, after the first conductive film 151 is formed conformally on the floating gates 122 and isolation films 130, the first conductive film 151 is annealed using hydrogen ($H_2$) or a compound of hydrogen (for example, $SiH_4$, $S_2H_6$, or $Si_3H_4$). For example, the first conductive film 151 is annealed at a temperature of 300 to 500° C. for 2 to 10 hours by directing gas comprising hydrogen onto the first conductive film 151 in a heated atmosphere.

As a result, hydrogen ions are injected into the first conductive film 151. Some of the hydrogen ions may penetrate the semiconductor substrate 100, as well. In any case, the hydrogen ions injected into the first conductive film 151 weaken the polysilicon that constitutes the first conductive film 151 and thereby increase the flowability of the first conductive film 151. Thus, the first conductive film 151 flows the upper portions of the floating gates 122 down onto the lower portions of the floating gates 122 and the upper portions of the isolation films 130. For the reasons explained above, this helps to prevent voids from being formed in the structure (portion of the control gate) subsequently formed on the isolation film(s) 130.

Figure 13:
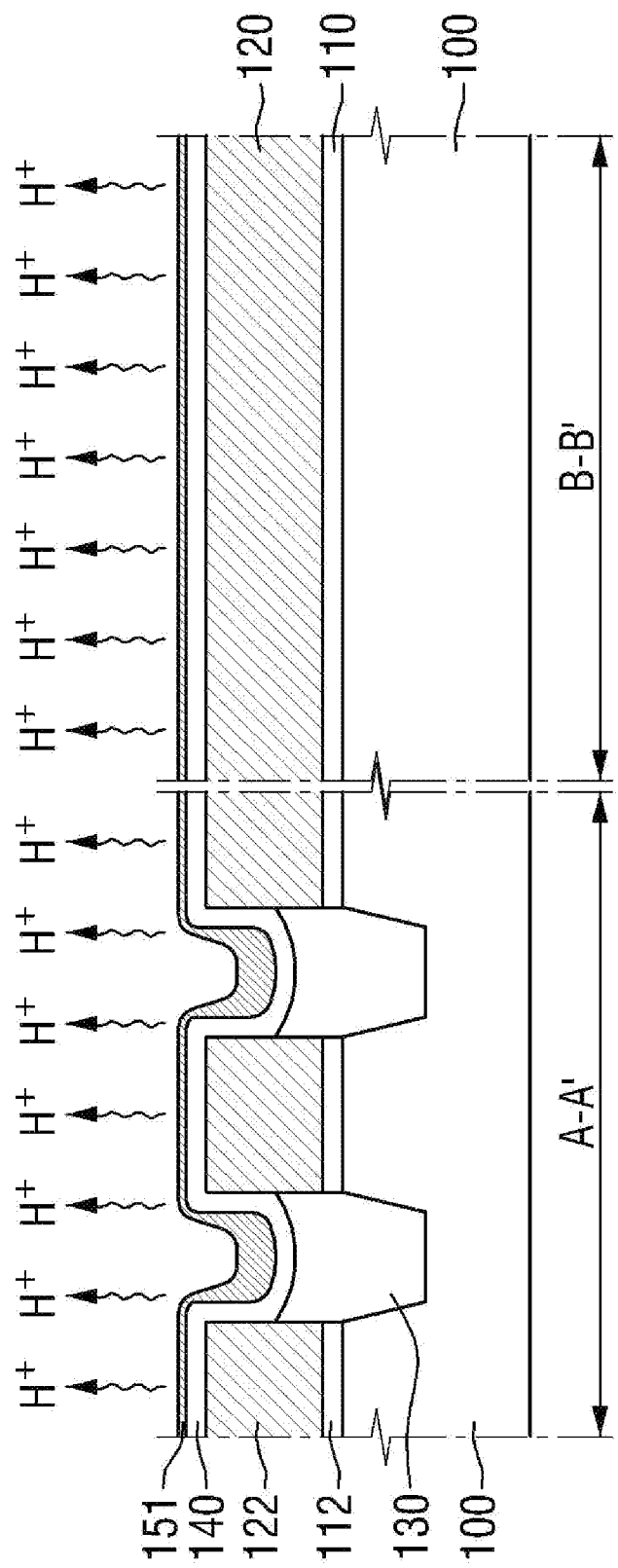

Referring to FIG. 13, the semiconductor substrate 100 is then annealed in an inert gas (for example, N2, He, or Ar) atmosphere. As a result, at least some of the hydrogen ions injected into the semiconductor substrate 100 are removed from the substrate to prevent current leakage or the like, which could otherwise arise due to the presence of the hydrogen ions in the semiconductor substrate 100.

The sequential annealing processes using hydrogen and inert gas, respectively, may also be applied to the second conductive film 152 and the third conductive film 153. That is, these annealing processes may be sequentially performed after the first conductive film 151 is formed, then again after the second conductive film 152 is formed, and then once again after the third conductive film 153 is formed.

Alternatively, the annealing processes of this embodiment and the annealing process of the embodiment of FIGS. 3-11 may be used in combination. For example, the first conductive film 151 may be sequentially annealed using hydrogen and inert gases, the second conductive film 152 may be annealed using laser beams, and then the third conductive film 153 may be sequentially annealed using hydrogen and inert gases. That is, the annealing processes may be used in combination as needed.

Next, still another embodiment of a method of fabricating a nonvolatile memory device according to the inventive concept will be described with reference to FIGS. 14 and 15. However, those steps/techniques of this embodiment which are similar to those described above with respect to the embodiment of FIGS. 3-11 will not be described in detail, for the sake of brevity.

Figure 14:
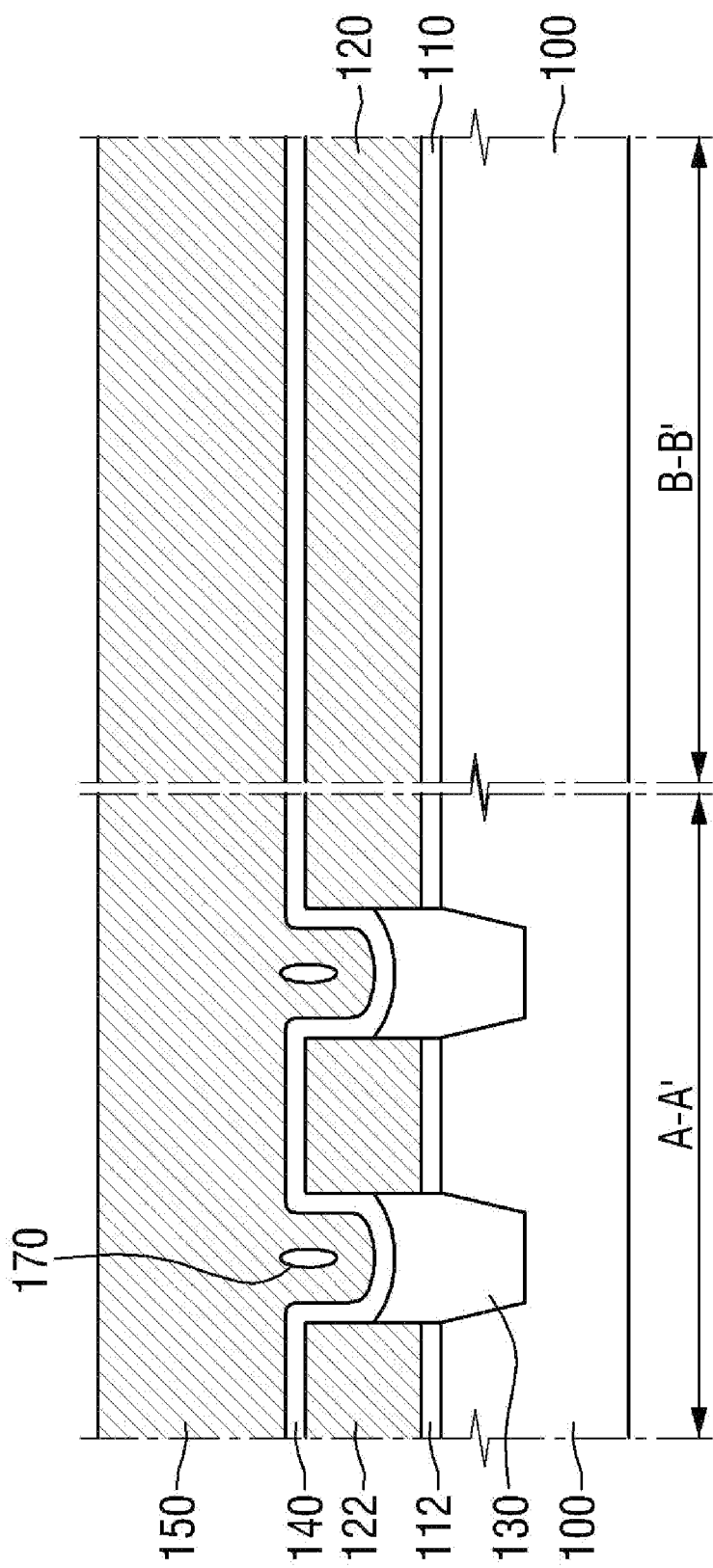
FIGS. 14 and 15 are sectional views illustrating intermediate steps of still another embodiment of a method of fabricating a nonvolatile memory device according to the inventive concept.

Referring to FIG. 14, control gate 150 is formed on gate insulating film 140. If the distance between the floating gates 122 (that is, the width L of the isolation film 130) is too narrow (for example, 20 nm or less), the material deposited to form the control gate 150 will not fill the gaps between the floating gates 122 completely, i.e., voids 170 will be formed in the control gate above the isolation film(s) 130.

Figure 15:
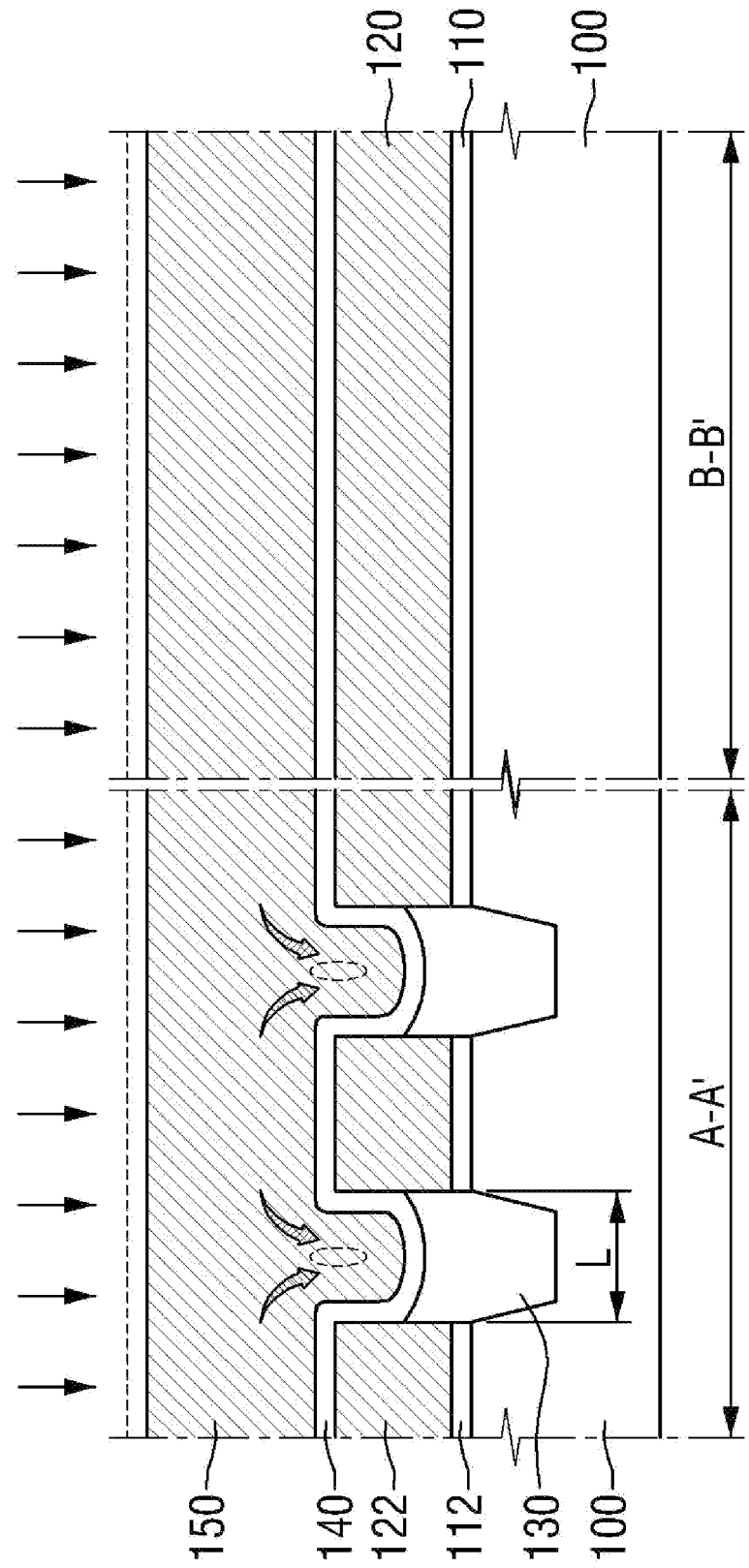

Next, referring to FIG. 15, the control gate 150 is annealed with a laser or using a gas comprising hydrogen. As was described above, such annealing weakens the polysilicon that constitutes the control gate 150 and thus, makes the control gate 150 flowable. Accordingly, the polysilicon particles that constitute the control gate 150 flow into the region of the voids (170 in FIG. 14). Thus, the voids (170 in FIG. 14) are removed.

Next, electronics that may employ a semiconductor device fabricated according to the inventive concept will now be described with reference to FIGS. 16 to 18.

Figure 16:
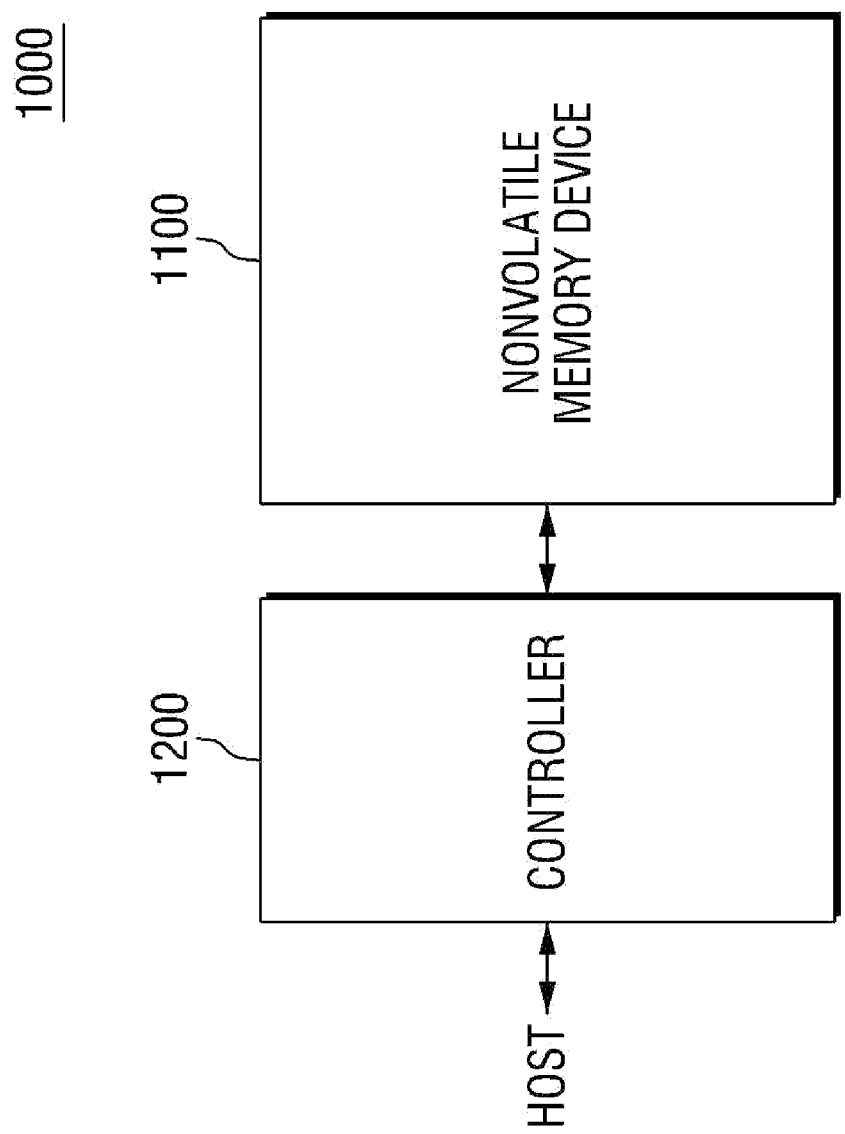
FIG. 16 is a block diagram of a memory system that may employ a semiconductor device fabricated according to the inventive concept.
Figure 17:
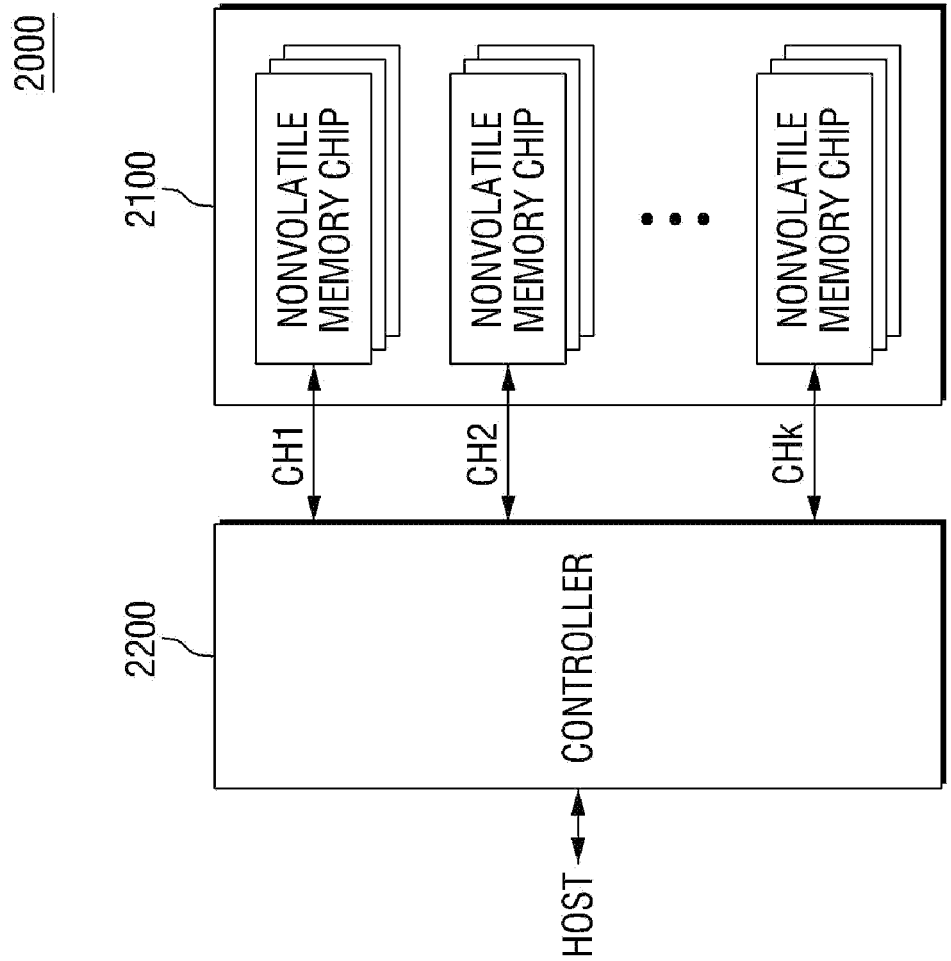
FIG. 17 is a block diagram of an example of an application of the memory system of FIG. 16.

FIG. 16 illustrates a memory system 1000 including a nonvolatile memory device 1100 and a controller 1200.

The nonvolatile memory device 1100 is fabricated according to the inventive concept so as to be highly reliable.

The controller 1200 is connected to a host and the nonvolatile memory device 1100. That is, the controller 1200 provides an interface between the nonvolatile memory device 1100 and the host. The controller 1200 is configured to access the nonvolatile memory device 1100 in response to a request from the host. For example, the controller 1200 is configured to control the read, write, erase, and background operations of the nonvolatile memory device 1100. Also, the controller 1200 may be configured to drive firmware for controlling the nonvolatile memory device 1100.

As an example, the controller 1200 includes a RAM (Random Access Memory), a processing unit, a host interface, and a memory interface. The RAM serves as at least one of an operating memory of the processing unit, a cache memory between the nonvolatile memory device 1100 and the host, and a buffer memory between the nonvolatile memory device 1100 and the host. The processing unit controls the overall operation of the memory system 1000.

The host interface provides a protocol for the exchanging of data between the host and the controller 1200. The protocol may be at least one of a USB (Universal Serial Bus) protocol, an MMC (MultiMedia Card) protocol, a PCI (Peripheral Component Interconnection) protocol, a PCI_E (PCI-Express) protocol, an ATA (Advanced technology Attachment) protocol, a serial-ATA protocol, a parallel-ATA protocol, an SCSI (Small Computer Small Interface) protocol, an ESDI (Enhanced Small Disk Interface) protocol, and an IDE (Integrated Drive Electronics) protocol. The memory interface provides an interface between the controller 1200 and the nonvolatile memory device 1100. For example, the memory interface includes a NAND interface or a NOR interface.

The memory system 1000 may additionally include an error correction block. The error correction block is configured to detect and correct errors of data read from the nonvolatile memory device 1100 using an error correction code (ECC). The error correction block may be provided as a constituent element of the controller 1200 or of the nonvolatile memory device 1100.

The controller 1200 and the nonvolatile memory device 1100 may be integrated. For example, the controller 1200 and the nonvolatile memory device 1100 may be integrated as a memory card, such as a PC card (PCMCIA: Personal Computer Memory Card International Association), a compact flash card (CF), a smart media card (SM or SMC), a memory stick, a multimedia card (MMC, RS-MMC, or MMCmicro), an SD card (SD, miniSD, microSD, or SDHC), or a universal flash storage device (UFS).

Alternatively, the controller 1200 and the nonvolatile memory device 1100 may be integrated as an SSD (Solid State Drive). An SSD is a storage device that has a semiconductor memory configured to store data. An SSD, in general, allows the host connected thereto to operate at relatively high speeds, i.e., higher than other storage devices such as disk drives allow.

In general, the memory system 1000 may for all practical purposes be employed by any wireless device capable of transmitting/receiving information, any electronic device constituting a home electronic network, any electronic device constituting a computer network, any electronic device constituting a telematics network, an RFID device, or by any type of computing system. More specifically, the memory system 1000 may be employed by any of various types of electronic devices, such as by a computer, UMPC (Ultra Mobile PC), workstation, net-book, PDA (Personal Digital Assistants), portable computer, web tablet, wireless phone, mobile phone, smart phone, e-book reader, PMP (Portable Multimedia Player), portable game machine, navigation device, black box, digital camera, three-dimensional television, digital audio recorder, digital audio player, digital picture recorder, digital picture player, digital video recorder, or digital video player.

Furthermore, the nonvolatile memory device 1100 or the memory system 1000 may be assembled into any of various types of packages. For example, the nonvolatile memory device 1100 or the memory system 1000 may be packaged in a PoP (Plastic Leaded Chip Carrier (PLCC)), ball grid array (BGA) package, chip scale package (CSP), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flapjack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), or wafer-level processed stack package (WSP).

A memory system employing a semiconductor device fabricated according to the inventive concept will now be described with reference to FIG. 17.

The memory system 2000 includes a nonvolatile memory 2100 and a controller 2200. The nonvolatile memory device 2100 includes nonvolatile memory chips one or more of which is fabricated according to the inventive concept. The nonvolatile memory chips are divided into several groups. The nonvolatile memory chips of each group communicate with the controller 2200 through a respective common channel. That is, the groups of nonvolatile memory chips communicate with the controller 220 through first to k-th channels CH1 to CHk, respectively.

Alternatively, the memory device 2100 of the memory system 2000 has several nonvolatile memory chips, and each of the chips is connected to the controller 2200 by a respective channel.

A computing system employing a semiconductor device fabricated according to the inventive concept will now be described with reference to FIG. 18. Te computing system 3000 includes a central processing unit 3100, a RAM (Random Access Memory) 3200, a user interface 3100, a power supply 3400, and a memory system 2000.

The memory system 2000 is electrically connected to the central processing unit 3100, the RAM 3200, the user interface 3300, and the power supply 3400 through a system bus 3500. The data that is provided through the user interface or is processed by the central processing unit 3100 is stored in the memory system 2000.

Figure 18:
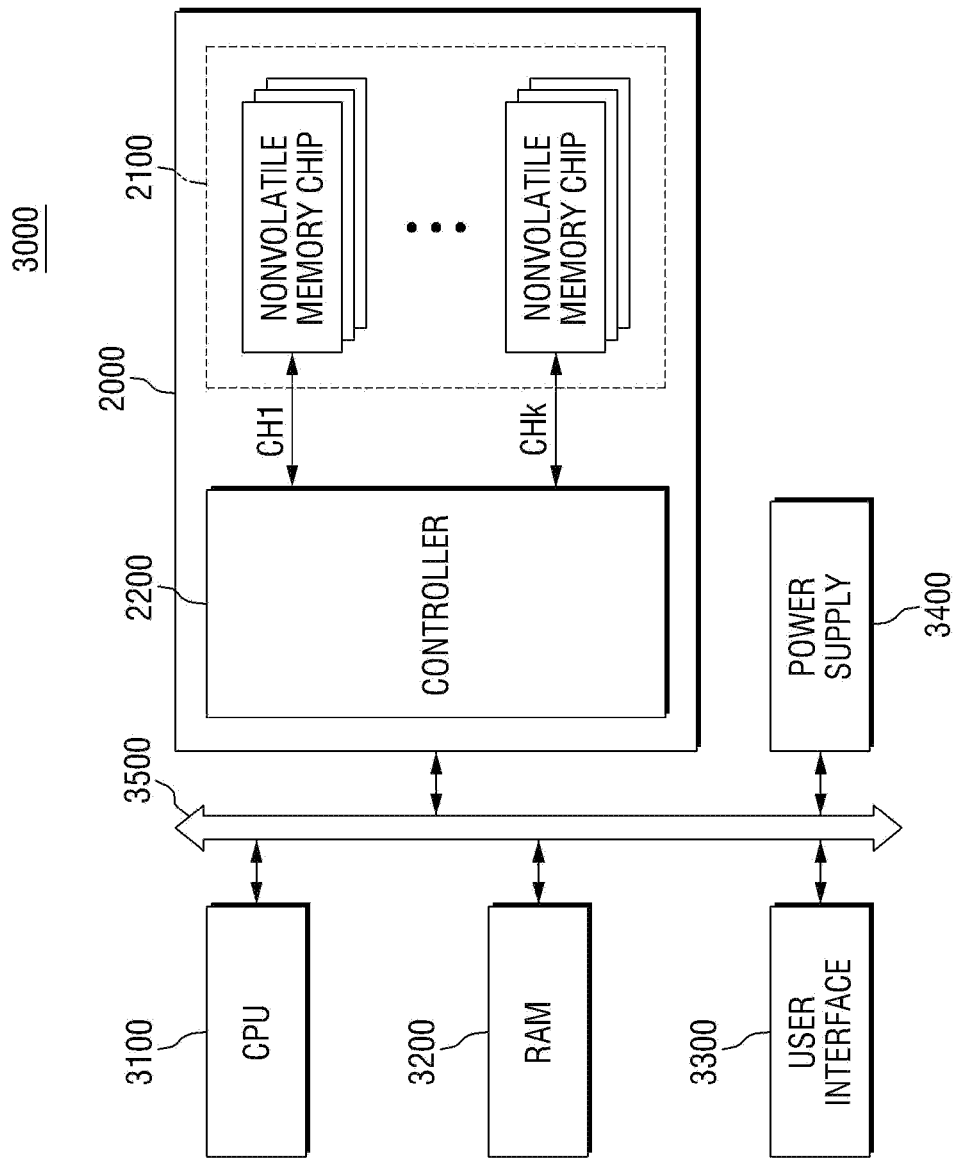
FIG. 18 is a block diagram of a computing system including a memory system of the type shown in and described with reference to FIG. 17.

Although FIG. 18 illustrates the nonvolatile memory device 2100 connected to the system bus 3500 through the controller 2200, to the nonvolatile memory device 2100 instead can be directly connected to the system bus 3500.

Also, although FIG. 18 illustrates an example of a computer system having a memory system 2000 of the type described above with reference to FIG. 17, the computer system may instead employ as its memory system the simpler memory system 1000 described above with reference to FIG. 16. That is, the computer system 3000 may employ any of the memory systems 1000 and 2000 as described above with reference to FIGS. 16 and 17.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of fabricating a nonvolatile memory device, comprising:

providing a structure including a floating gate on a semiconductor substrate, an isolation film adjacent to the floating gate on the semiconductor substrate and having an upper surface at least a portion of which is located at a level beneath the level of the upper surface of the floating gate, and a gate insulating film extending over a side wall of the floating gate and across the upper surface of the isolation film, the structure having a recess defined therein above a portion of the gate insulating film that extends across the upper surface of the isolation film;

forming a conductive layer on the gate insulating film, wherein the forming of the conductive layer comprises conformally forming a lower conductive film on the gate insulating film such that the lower conductive film conforms to the topography of the underlying structure, and forming an upper conductive film on the at least one lower conductive film; and annealing the conductive layer, wherein the annealing comprises annealing the lower conductive film to such an extent that part of the conductive film flows from the level of an upper portion of the floating gate down to the level of a lower portion of the floating gate over the portion of the gate insulating film that extends across the upper surface of the isolation film.

2. The method of fabricating a nonvolatile memory device of claim 1, wherein the annealing comprises irradiating the lower conductive film with a laser.

3. The method of fabricating a nonvolatile memory device of claim 1, wherein the forming of the conductive layer and the annealing of the conductive layer comprise:

conformally forming a first conductive film on the gate insulating film;

annealing the first conductive film;

subsequently forming a second conductive film on the first conductive film; and subsequently annealing of the second conductive film.

4. The method of fabricating a nonvolatile memory device of claim 3, wherein the second conductive film is formed to a thickness greater than that to which the first conductive film is formed.

5. The method of fabricating a nonvolatile memory device of claim 3, wherein the first conductive film is formed without being doped with either N-type or P-type impurities; and the second conductive film is formed by forming a second layer of material on the first conductive film and doping the second layer with N-type or P-type impurities.

6. The method of fabricating a nonvolatile memory device of claim 1, wherein the forming of the conductive layer and the annealing of the conductive layer comprise:

conformally forming a first conductive film on the gate insulating film;

annealing the first conductive film to such an extent that the first conductive film begins to flow along the gate insulating film;

forming a second conductive film on the first conductive film;

annealing the second conductive film to such an extent that the second conductive film begins to flow along the first conductive film;

forming a third conductive film on the second conductive film; and annealing the third conductive film to such an extent that the second conductive film begins to flow along the second conductive film.

7. The method of fabricating a nonvolatile memory device of claim 6, wherein the second conductive film is formed to a thickness greater than that to which the first conductive film is formed, and the third conductive film is formed to a thickness greater than of the thickness to which the second conductive film is formed.

8. The method of fabricating a nonvolatile memory device of claim 6, wherein the second conductive film is formed by forming a second layer of material on the first conductive film and doping the second layer with N-type or P-type impurities at a first concentration, and the third conductive film is formed by forming a third layer of material on the second conductive film and doping the third layer with N-type or P-type impurities at a second concentration that is different from the first concentration.

9. The method of fabricating a nonvolatile memory device of claim 8, wherein the second concentration is higher than the first concentration.

10. The method of fabricating a nonvolatile memory device of claim 1, further comprising introducing impurities into the conductive layer to adjust the size of grains of the conductive layer.

11. The method of fabricating a nonvolatile memory device of claim 1, wherein the width of the isolation film is 0.1 to 20 nm.

12. The method of fabricating a nonvolatile memory device of claim 1, wherein the lower conductive film is formed directly on the gate insulating film to a thickness less than the depth of the recess.

13. A method of fabricating a nonvolatile memory device, comprising:

providing a structure including a floating gate on a semiconductor substrate, an isolation film adjacent to the floating gate on the semiconductor substrate and having an upper surface at least a portion of which is located at a level beneath the level of the upper surface of the floating gate, and a gate insulating film extending over a side wall of the floating gate and the upper surface of the isolation film;

forming a conductive layer on the gate insulating film; and annealing the conductive layer to such an extent that part of the conductive layer flows from the level of an upper portion of the floating gate down to the level of a lower portion of the floating gate over an upper portion of the isolation film, and wherein the annealing comprises introducing hydrogen ions into the conductive layer.

14. The method of fabricating a nonvolatile memory device of claim 13, further comprising subsequently annealing the semiconductor substrate in an atmosphere of inert gas.

15. A method of fabricating a semiconductor memory device, comprising:

forming floating gates spaced apart from one another along an axis on a semiconductor substrate such that a gap exists between adjacent ones of the floating gates, wherein upper surfaces and at least part of sidewall surfaces of the floating gates are exposed;

forming a gate insulating film on a structure comprising the floating gates such that the gate insulating film has a topography conforming to said upper surfaces and at least part of the sidewall surfaces of the floating gates;

forming a conductive layer on the gate insulating film; and annealing the conductive layer to such an extent that part of the conductive layer flows down from upper portions of the floating gates towards lower portions of the floating gates, wherein the forming of the conductive layer comprises forming a film of polysilicon and doping the film with conductive impurities, and wherein the annealing comprises introducing hydrogen ions into the polysilicon.

16. The method of fabricating a nonvolatile memory device of claim 15, wherein the gap has a width of 0.1 to 20 nm.

* * * * *